April 25, 1967 M. J. BRAUN 3,315,309

APPARATUS FOR MOLDING COMPOSITION RESISTORS

Original Filed Nov. 22, 1963 2 Sheets-Sheet 1

INVENTOR
MARINUS J. BRAUN
BY Robert J. Crawford
ATTORNEY

April 25, 1967 M. J. BRAUN 3,315,309

APPARATUS FOR MOLDING COMPOSITION RESISTORS

Original Filed Nov. 22, 1963 2 Sheets-Sheet 2

INVENTOR
MARINUS J. BRAUN

BY Robert J. Crawford
ATTORNEY

United States Patent Office 3,315,309

Patented Apr. 25, 1967

3,315,309

APPARATUS FOR MOLDING COMPOSITION RESISTORS

Marinus J. Braun, Youngstown, N.Y., assignor to Air Reduction Company, Incorporated, New York, N.Y., a corporation of New York Original application Nov. 22, 1963, Ser. No. 325,643. Divided and this application May 24, 1966, Ser. No. 552,453

1 Claim. (Cl. 18—16.5)

This is a division of application Ser. No. 325,643, filed Nov. 22, 1963.

This invention relates to an apparatus for molding composition resistors and the like that are provided with parallelly arranged axially extending external connecting leads.

It is now common practice to mount resistors and other circuit components upon board panels, particularly printed circuit boards, which boards carry printed, electrolytically deposited, etched or otherwise prepared interconnecting conductors, the components being connected in place on the board by inserting the leads from the component through prepared holes in the circuit board and completing the electrical connection of the component into the circuit by suitable means such as dip-soldering. By this procedure, usually a large number of circuit components may be soldered in place with a single dip-soldering operation.

Since the time before such circuit assembly methods were developed, circuit components have conventionally been provided with coaxial external connecting leads. For example, the usual circuit component has been cylindrical in shape with a lead protruding from each end. To mount the conventional circuit components upon a circuit board it has been necessary to bend the leads to bring them into position to thread through the proper holes in the circuit board. The result may be that undesirably long leads are required or that the circuit component when in place takes up too much space. In any event, the substitution of parallel leads extending axially from one end of the component makes the component easier to handle during assembly upon a circuit board and enables the component and associated leads to take up less space in the finished device.

In making a molded composition resistor in accordance with the apparatus of the invention, I place powdered resistive material in a U-shaped configuration within a partially molded body of granular insulating material in a mold according to a particular procedure to be described below, place parallel leads in position in contact with the resistive material, and further mold and set the assembled parts into a unit of the desired form. The process and assembly procedure involve the use of punches and dies of special form to effect the desired results.

Other features, objects and advantages will appear from the following more detailed description of an illustrative embodiment of the invention, which will now be given in conjunction with the accompanying drawings.

Figures 1, 2, 3, 4, 5:
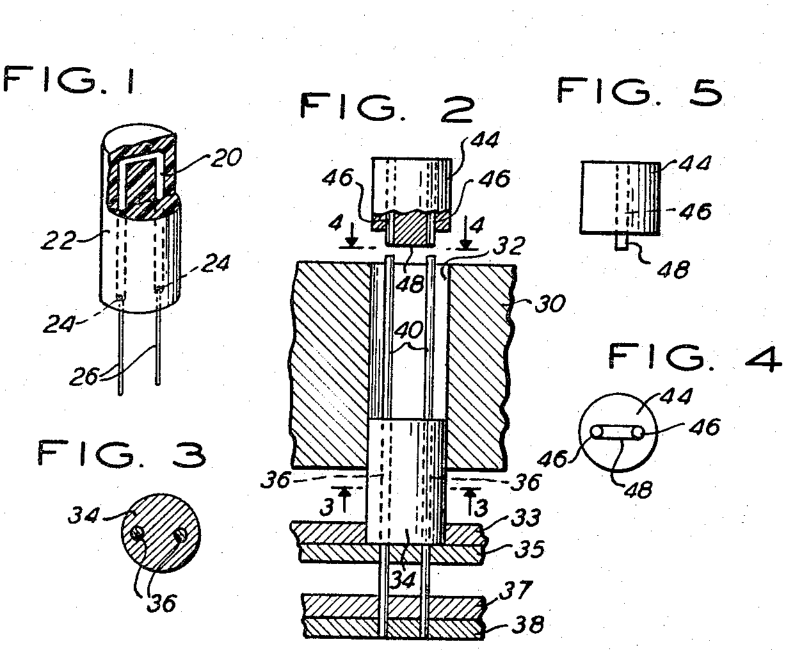
FIG. 1 is a perspective view, partly broken away, of an illustrative resistor made in accordance with the present invention.
FIG. 2 is a vertical section through a mold and punch parts, showing the method of forming a cavity to receive the powdered insulating material in the initial molding operation.
FIG. 3 is a cross-sectional view of a shell pin appearing in axial section in FIG. 2, taken along the line 3—3 in that figure.
FIG. 4 is a bottom view of a top punch appearing in axial section in FIG. 2, taken along the line 4—4 in that figure.
FIG. 5 is a side elevation of the top punch appearing in FIGS. 2 and 4.

Referring to the drawings, FIG. 1 is a view of one form of resistor made according to the present invention. The resistance element of the resistor is a U-shaped filament 20 embedded in an encapsulating mass 22 of insulating material. Solid metal terminal blocks 24, integral with or conductively attached to parallel leads 26 are in intimate conductive contact with the respective ends of the filament 20.

The filament 20 may be made of a mixture of suitable proportions of (1) material of high specific resistance, for example calcined carbon black, or graphite, or both, (2) filler material, for example silica powder, and (3) a binder, for example a thermosetting resin of the phenol-formaldehyde type. These materials are thoroughly blended to constitute the resistor mix, which will sometimes be referred to herein as the core mix, inasmuch as it is placed in a cavity within the surrounding insulating material. By varying the proportion of the first item in the core mix the resistance of the finished resistor may be given the desired value.

The encapsulating mass 22 may be made of a mixture of silica sand, asbestos, and binders such as thermosetting resins of the phenol-formaldehyde type. These materials are thoroughly blended to constitute the shell mix.

Figure 11:
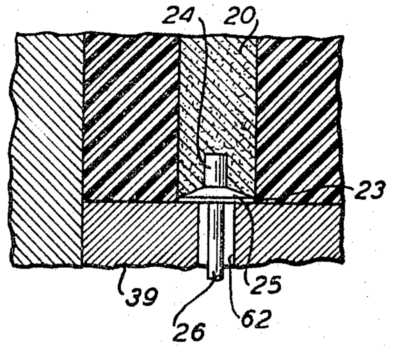
FIG. 11 is a fragmentary view showing a terminal lead in the form of a wire with upset head extending into and closing off the bottom of a cavity in a molded shell, which cavity is filled with a resistive powder to be molded into a resistive filament.

The terminal connecting leads 26 may be made of copper wire, with an end portion forming a terminal head 24, preferably having a collar portion 25 of approximately the same diameter as the filament 20, as shown in FIG. 11.

The apparatus for producing the resistor is illustrated more or less diagrammatically in FIGS. 2 through 11. A die block 30 has a die opening 32 therethrough in which the resistor will be assembled and molded. In the drawings a single die opening is shown, but in commercial practice the die block probably would be provided with a number of die openings for substantially simultaneous assembly and molding of resistors in quantity production. A forming part, herein called a shell pin, is shown at 34, and constitutes a cylindrical member with parallel plane and surfaces perpendicular to the cylindrical axis of the pin. The shell pin 34 fits into the die opening 32 with a close sliding fit and is provided with the usual alignment plate 33 and back-up plate 35. The pin is made of solid metal except that it contains two axially drilled holes 36 extending through the part from end to end, as shown in end view in FIG. 3. Another back-up plate 38 is provided from which extend two core pins 40 arranged to be inserted through the holes 36 in the shell pin 34, and through aligned holes in the back-up plate 35, as shown in FIG. 2, with a close sliding fit. Another alignment plate 37 is provided to fit over the back-up plate 38 around the bases of the core pins 40 as shown. A top punch 44 is provided which also makes a close sliding fit with the die opening 32 and is bored with holes 46 which make a close sliding fit with the core pins 40. The punch 44 has a bottom extension 48 and the holes 46 extend through the punch from end to end, including the bottom extension 48, as shown in FIGS. 2, 4 and 5.

With the shell pin 34 and core pins 40 in place in the die opening 32 as shown in FIG. 2, a preferably measured quantity of the shell mix is placed in the die opening 32 in the space surrounding the core pins 40. In accordance with conventional practice the die block will now be rapped or vibrated to insure settlement of the shell mix in uniform layers.

Figure 6:
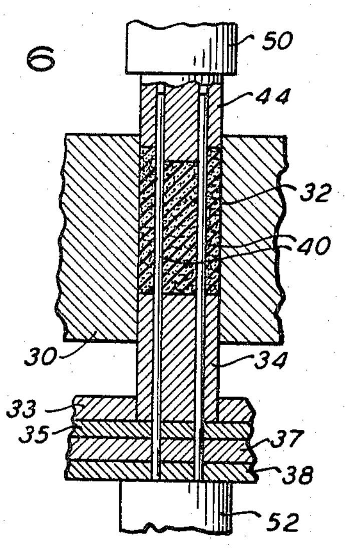
FIG. 6 is a vertical section through the mold showing the powdered insulating material partially molded, with punch parts and core pins forming a cavity for later receiving powdered resistor mix material.
Figure 7:
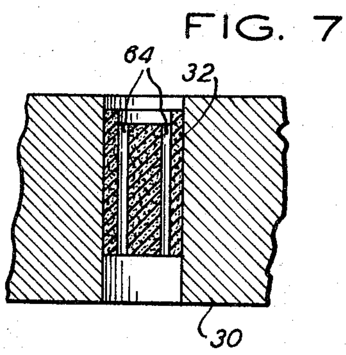
FIG. 7 is a vertical section through the mold showing the partially molded insulating material after the core pins and punch parts have been removed.

Next the top punch 44 is inserted in the die opening 32, sliding over the core pins 40, and hydraulic pressure is applied between the base plate 38 and the top punch 44, in known manner. FIG. 6 shows the configuration obtaining after the hydraulic pressure has been applied, upper and lower jaws of the hydraulic press being shown conventionally at 50 and 52 respectively. In this operation, the shell mix is partially compacted and molded to such an extent that upon retraction of the press jaws and removal of the top punch 44, the core pins 40 and the shell pin 34, the shell mix will remain held by friction within the die opening 32 and will retain its impressed shape due to compaction as shown in FIG. 7. The molded shell mix now has the form of the die opening 32 as well as two cylindrical cavities that have been formed by the core pins and an indentation at the top that has been formed by the bottom extension 48 on the top punch 44 which joins the two cylindrical cavities to define a U-shaped cavity.

Figure 8:
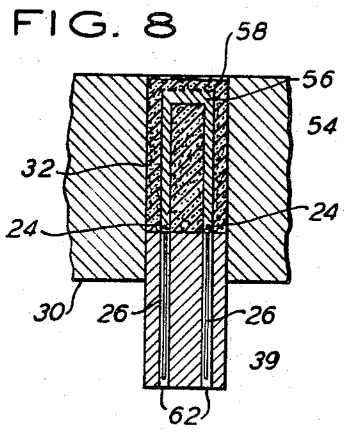
FIG. 8 is a vertical section through the mold with parallel leads being held in place by a punch part and with powdered resistor material in place in the cavity formed therefor and covered with additional powdered insulating material.

Next, a molding punch 39 is provided of the same outside diameter as the shell pin 34 but with axial holes 62 of smaller diameter than the holes 36 in shell pin 34. Leads 26, with enlarged or upset head 24 and collar 25 are inserted into the holes 62 with the collars 25 resting upon the flat upper surface of the punch 39. The holes 62 are coaxial with the cavities 64 so that the collars 25 serve to close off the bottoms of the cavities 64 as shown in FIG. 8, when the punch 39 is slid up into the die opening 32 until the punch presses against the bottom of the formed shell. To more effectively close off the cavity 64 and positively guide the collar 25 to assume a coaxial relationship to the cavity 64, the collar 25 is preferably provided with a short right cylindrical lower portion 23 as shown in FIG. 11.

In an illustrative example, where the filament 20 of resistive material has a diameter of 0.093 inch, the terminal lead 26 may comprise a wire of 0.020 inch diameter with an upset head 24 that is about 0.030 inch in diameter and a collar 25 of 0.093 inch outside diameter, the collar having a flat lower surface to present a bearing surface to the top surface of the punch 39. The holes 62 in the punch 39 may be of somewhat greater diameter than the shank of the lead 26, for example, about 0.040 inch diameter.

Then a suitable, preferably measured amount of core mix is poured into the cylindrical cavities and into the depression formed by the extension 48, settled in place and covered over with more of the shell mix, as also shown in FIG. 8. In this figure, partially formed shell mix is shown at 54, settled core mix at 56 and the top covering of shell mix at 58. The top covering 58 is preferably settled after the settling of the core mix is completed.

Figure 9:
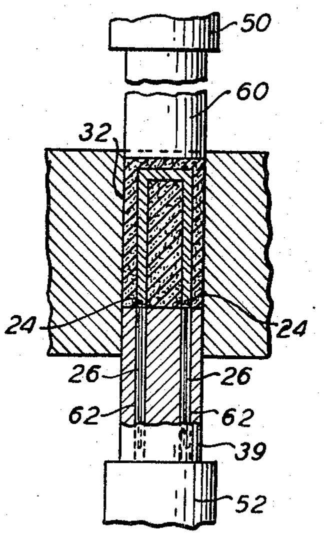
FIG. 9 is a vertical section through the mold showing the fully molded resistor in the die opening after the final molding.

A plain top punch 60, which may be a solid cylindrical bar with parallel top and bottom surfaces perpendicular to its axis, is next inserted in the die opening above the partially formed resistor and hydraulic pressure is again applied by jaws 50 and 52, this time the upper jaw 50 bearing against the top of the top punch 60 and the lower jaw 52 bearing against the bottom of the molding punch 39 shown in FIG. 9. This operation presses the resistor core mix in the cavities 64 firmly into intimate contact with the heads 24 and collars 25 and molds the resistor core mix. It also completes the molding of the partially compacted shell mix 54 and molds the top covering of shell mix into an integral part of the whole. The pressure employed will be sufficient to mold the resistor to the desired self-sustaining form and this may vary from a moderate pressure, for example about 1300 pounds per square inch, on up to pressures much higher, depending on the materials used, the dimensions of the resistors, and other factors. Following the molding operation the resistor will be ejected from the mold, for example by the top punch 60 which may be made long enough to push the molded resistor out of the die block.

Figure 10:
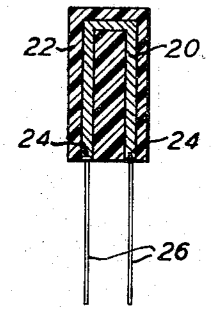
FIG. 10 is a vertical section through the fully molded resistor.

The molded resistor now has the form shown in axial section in FIG. 10 and in perspective in FIG. 1.

After molding, the resistors may be cured in an oven to cause the resin to set. The curing temperature may vary depending on the particular thermosetting resin used, the time of curing, the size of the resistors, and other factors, but for phenol-formaldehyde resin may be somewhat less than 400° F. If desired, the curing may be done in a neutral (nitrogen) atmosphere, or in a reducing (hydrogen) atmosphere, although with the preferred compositions described hereinabove this was not found to be necessary to prevent oxidation of the metal terminals and leads.

Following the curing operation the resistors desirably will be impregnated and coated with a wax or other resin to make them more resistant to the effects of moisture. This treating material, may for example, be of the type disclosed in the Veley Patent 2,313,853, Mar. 16, 1943.

While I have shown and described apparatus for making a resistor in accordance with the invention, it will be evident to those skilled in the art that other circuit components involving combinations of conductors and insulators, such for example as capacitors, may be produced in similar manner by making suitable changes in the forms of the core pins and punch parts.

While illustrative forms of apparatus in accordance with the invention have been described and shown herein, it will be understood that numerous changes may be made without departing from the general principles and scope of the invention.

I claim:

Apparatus for molding insulated resistors, comprising in combination, a die block having a die opening therethrough of predetermined shape to form the shape of the finished resistor, said die opening being of suitable shape to receive in close sliding fit a plurality of punch parts so that any said punch part can be slid through said die opening from end to end of the opening, first and second punch parts for said die opening, said punch parts having alignable openings therethrough to accommodate in close sliding fit a pair of core pins, a base plate supporting a said pair of core pins in relative position to be slid into said alignable openngs when said punch parts are in place in said die opening, a first of said punch parts having a projection on one end thereof, said projection extending from one said alignable opening to the other so as to form a core spanning the space from one said core pin to the other when said first punch part receives said core pins within the said alignable openings in said punch part, means to compress moldable insulating material between said punch parts by pressure applied between said base plate and said first punch part while said punch parts are spaced apart within said die opening and said core pins are present in the said alignable openings, said base plate transmitting pressure against one end of the second of said punch parts; a third punch part for said die opening, said punch part having a solid flat face, a fourth punch part for said die opening, said punch part having openings therethrough alignable with the said openings in said first and second punch parts and of slightly less diameter for holding terminal leads in place during molding and thereby preventing escape of moldable resistive material from the cavities formed by the said core pins, and means to apply pressure upon moldable material between said third and fourth punch parts after said base plate and core pins have been removed and the said cored cavity has been filled with moldable resistive material to complete the molding of the resistor.

References Cited by the Examiner

UNITED STATES PATENTS

| | | | |
|---|---|---|---|
| 2,338,491 | 1/1944 | Cutler | 18—16.5 |
| 2,398,227 | 4/1946 | Hubbert | 18—16.5 |
| 2,798,255 | 7/1957 | Winters. | |
| 3,084,391 | 4/1963 | Parstorfer | 249—142 X |
| 3,132,379 | 5/1964 | Crane | 18—16.5 |

J. SPENCER OVERHOLSER, *Primary Examiner.*

J. HOWARD FLINT, Jr., *Examiner.*